(12) United States Patent
Blacquiere et al.

(10) Patent No.: US 7,483,324 B2
(45) Date of Patent: Jan. 27, 2009

(54) MEMORY DEVICE AND METHOD PROVIDING AN AVERAGE THRESHOLD BASED REFRESH MECHANISM

(75) Inventors: Johannis F. R. Blacquiere, Eindhoven (NL); Victor M. G. Van Acht, Waalre (NL)

(73) Assignee: NXP B.V., Eindhoven (NL)

( * ) Notice: Subject to any disclaimer, the term of this patent is extended or adjusted under 35 U.S.C. 154(b) by 90 days.

(21) Appl. No.: 11/577,711

(22) PCT Filed: Oct. 17, 2005

(86) PCT No.: PCT/IB2005/053393

§ 371 (c)(1),
(2), (4) Date: Apr. 20, 2007

(87) PCT Pub. No.: WO2006/043225

PCT Pub. Date: Apr. 27, 2006

(65) Prior Publication Data

US 2008/0062769 A1  Mar. 13, 2008

(51) Int. Cl.
*G11C 7/00* (2006.01)

(52) U.S. Cl. ............. 365/222; 365/185.25; 365/185.24; 365/189.07

(58) Field of Classification Search ............ 365/185.25, 365/185.24, 189.07, 222
See application file for complete search history.

(56) References Cited

U.S. PATENT DOCUMENTS

| 4,309,694 | A | 1/1982 | Henry |
|---|---|---|---|
| 5,532,962 | A | 7/1996 | Auclair et al. |
| 6,490,200 | B2 * | 12/2002 | Cernea et al. .......... 365/185.21 |
| 6,714,453 | B2 | 3/2004 | Cavaleri et al. |
| 6,735,114 | B1 | 5/2004 | Hamilton et al. |
| 2002/0181284 | A1 | 12/2002 | Kiyoshi |
| 2004/0170058 | A1 | 9/2004 | Gonzalez et al. |

FOREIGN PATENT DOCUMENTS

| EP | 04103588.2 | 7/2004 |
| EP | 04101675.9 | 4/2007 |

* cited by examiner

*Primary Examiner*—Anh Phung
*Assistant Examiner*—Toan Le
(74) *Attorney, Agent, or Firm*—Peter Zawilski (57) ABSTRACT

The present invention relates to a non-volatile memory device, comprising a memory array (10, 20) with a plurality of memory cells (100, 200) arranged in rows and columns, bit line conductors (12, 22) coupled to said rows of memory cells, an averaging circuit (11, 21) with inputs coupled to a plurality of said bit line conductors (12, 22) and being arranged to determine an average level on respective analog signal levels on said plurality of bit line conductors (12, 22), a monitoring circuit (13, 23) coupled to said averaging circuit (11, 21) and being arranged to monitor said average level and to output a refresh command when said average level shows a predetermined behavior, and a refresh circuit (15, 25) coupled to said monitoring circuit (13, 23) and being arranged to refresh at least a selection of said plurality of memory cells (100, 200) in response to said refresh command.

18 Claims, 4 Drawing Sheets

MEMORY DEVICE AND METHOD PROVIDING AN AVERAGE THRESHOLD BASED REFRESH MECHANISM

The invention relates to a non-volatile memory device and more particular to an electronically programmable and erasable non-volatile semiconductor memory device such as EPROM, flash memory or the like. It further relates to a method of refreshing such a non-volatile memory device.

Non-volatile memory devices are known in the art. EPROM or flash memories, for example, traditionally were used in applications where semi-permanent storage of data with limited reprogramming were required. However, nowadays EPROM and flash memories are intended to replace magnetic disks and other permanent mass storage media, making high demands on reliability and availability of the memory.

Such known memory devices contain a memory array with a plurality of memory cells being arranged to form a two dimensional matrix of rows and columns. Each memory cell therein comprises a floating gate field effect transistor with its gate connected to a word line (row), its drain connected to a bit line (column) and its source connected to a source line. The bit lines normally are grouped in columns of rank k to form binary words with k bits length. Cells connected to the same word line form a physical page of the flash memory, thus comprising a plurality of binary words. The memory array is divided into sectors formed by a set of pages in which the source lines are electrically connected.

In general, each memory cell of such a memory device stores a bit of data using some conserved physical quantity that can be affected during writing and sensed during reading. In many programmable memories the physical quantity is the charge on an electrically isolated electrode. In case of a flash memory, for example, transistors contain an additional polysilicon region generally referred to as the floating gate. Data is memorized through confinement of predefined amounts of electric charge in this floating gate. More precisely, the electric charge transferred to the floating gate from the substrate through a dielectric region affects the conductivity of the source-drain channel and the threshold voltage of the field effect transistor. Physically, the differences in threshold voltages and the differences in the source-drain currents, due to the confinement of different amounts of electric charge in the floating gates, can then be used to define different logic states (e.g. "0", "1", . . . ; "low", "high", . . . ). Physical quantity, however, herein is to be understood in broader sense including, for example, the magnetization of a piece of magnetizable material, polarization of ferroelectric material, a resistance etc.

Each memory cell is provided with a conversion mechanism, for producing an electrical signal that depends on the value of the physical quantity. The sensing mechanism supplies the electrical signal to the bit line. More general, bit line is to be understood as line that carries signals representing digits, typically binary digits, i.e. bits, but not excluding q-ary digits with q>2. The resulting electrical signal on the bitline is in essence an analog signal, i.e. a signal that may assume any one of a continuous range of values. This is inevitable for memory cells that use analog physical quantities to represent data, but even for cells that store data as discrete states, such as SRAM cells with cross-coupled inverters, the electrical signal on the bitline often has an analog character, because the driving strength of the cells is relatively small compared with other factors that affect the signal on the bitline.

Therefore, a sensing circuit is connected to the bitlines to convert the analog electrical signal on the bitlines to discrete logical signals which typically represent which of two (or more) discrete logical values has been detected by outputting a signal value from one of two (or more) separate ranges. To distinguish whether one logical value or the other should be output, the sensing circuit compares the analog electrical signals on the bitlines with a reference level. Dependent on whether the analog electrical signal on a bit line is above or below the reference level, the sensing circuit outputs a digital signal which represents first or a second logic level respectively. The reference level, thereby, must be set carefully, so that factors that are unrelated to the data stored in the cell do not affect the sensing result.

Under "normal" conditions a two-state memory cell, for example, is erased with sufficient margin below the reference level and programmed with sufficient margin above the reference level. Due to technological progress memory devices such as flash memories have the advantage of being very compact in terms of the area of occupied silicon and, thus, for the same silicon area, have a significantly greater storage capacity. Due to the decreased memory cell size, however, after long retention periods and/or after frequent read, write and erase accesses to memory cells in same location of the memory array they are susceptible to defects and failures. In flash memories, for example, charge leaks from or onto the floating gate. Therefore, the threshold voltage of the floating gate transistor memory cells may shift. The shifting of the threshold voltage in a memory cell is partly due to aging but also to ambient conditions such as stress from normal operations (erase, program or read) on adjacent areas of the memory array creating perturbations in that respective memory cell. Memory cells of the other pages, for example, are directly connected to the bit lines and are not protected by an access transistor. The memory cells will repeatedly receive on their drains the programming voltage applied to the cells of the neighbouring page on which the user carries out erase and programming cycles, which will cause a gradual modification of electrical charges trapped in their floating gates. When due to such perturbations the threshold voltage is shifted from its programmed level, the reliability of reading the intended memory state may be compromised. These "soft errors", in their initial stages, are not severe enough to be readily detected during normal operations of the memory device. However, if the shifting is allowed to continue beyond the reference level the soft errors will eventually produce read errors.

Therefore, in U.S. Pat. No. 5,532,962, for example, a refresh mechanism for flash memories is claimed according to which the threshold voltage of all individual memory cells is checked in the memory array after programming each word or after a number of word programming cycles. More particular, cells are tested to determine if their margins are maintained, and if the threshold voltage of any individual cell falls below an authorized reference value, all memory cells in that specific area of memory are reprogrammed. However, the disadvantage of this type of checking process on the entire memory array is that it significantly slows down operation of the memory by unnecessarily occupying the microcontroller controlling the refreshing operation, while the other cells in that area are still ok. Furthermore, this causes extra wear to those correctly functioning cells and can even cause overprogramming.

In U.S. Pat. No. 6,714,453 a refresh mechanism is described trying to solve the above mentioned drawback by refreshing or reprogramming memory cells only page-wise and monitoring the refresh operation by incrementing a non-volatile counter formed by at least one row of floating gate transistors. However this solution still suffers from the above mentioned problems, particularly, when one cell in a page is malfunctioning and therefore constantly provokes refresh operations.

An object of the present invention therefore is to provide a non-volatile memory device and a method of refreshing such a device allowing for an improved refresh mechanism.

According to a first aspect of the invention this object is achieved by a non-volatile memory device, comprising a memory array with a plurality of memory cells being arranged in rows and columns, bit line conductors being coupled to said rows of memory cells, an averaging circuit with inputs coupled to a plurality of said bit line conductors, said averaging circuit being arranged to determine an average level on respective analog signal levels on said plurality of bit line conductors, a monitoring circuit coupled to said averaging circuit, said monitoring circuit being arranged to monitor said average level and to output a refresh command when said average level shows a predetermined behaviour, and a refresh circuit being coupled to said monitoring circuit and being arranged to refresh at least a selection of said plurality of memory cells in response to said refresh command.

While in all former approaches the refresh operation was triggered by the behaviour of the analog memory cell output of any cell, the present invention is based on the realization that a refreshing operation on a group of memory cells can as well be triggered if an average level of the memory cells content of a group of cells shows a predetermined behaviour. In principle, predetermined behaviour can be any anomalous detectable behaviour of said group (or plurality) of cells. The consequence that refreshing might come too late for an individual cell, e.g. one which is malfunctioning, can be accepted since the resulting data error in most instances can be corrected by an error correction code or algorithm (ECC). In this way it can be prevented that a single malfunctioning cell would cause an unnecessarily high refresh frequency. Also, early wear of memory cells due to the high refresh frequency is prevented.

The invention may be applied to memories with cells that output information about binary bit signals on each bit line conductor, but also the memories with cells that output q-ary signals (with q>2). In the latter case at least two average levels are output by said averaging circuit and monitored by said monitoring circuit. The term bit line conductors will be maintained throughout this specification although they may carry signals selected from q levels with q>2.

The average level, in principle, can be derived from any plurality of said analog signal levels, i.e. from a pair of memory cells up to a full page. Preferably, bit line conductors for all bits in a word, or substantially all bit line conductors from a memory matrix are used for averaging, e.g. bit line conductors for eight bits, sixty four bits, a hundred and twenty eight bits or even more. Even averaging over a number of successively read-out pages is possible. The more cells are read out for averaging, the more robust the average level will be against single cell shifts. On the other hand, the number of averaged cells should not be too large in order to limit the probability of unrecognized malfunctioning cells so that the capacity of an ECC will not be exceeded and corrupt data can be reliably corrected.

The averaging circuit inputs can be either coupled directly or indirectly to the plurality of said bit line conductors or both. By this means, if desired, selections of analog signal levels on said plurality of bit line conductors can be effected. Hence, in its broadest meaning average level covers average levels of any (sub-)sets of selected analog signals on said bit lines. In particular, in a binary memory device an "over-all" average level, an average "high" level of analog signals representing binary "1" states, and an average "low" level of analog signals representing binary "0" states can be monitored as will be explained below in more detail. Also, more than one and even all of these average levels can be determined successively or in parallel in order to monitor their relative behaviour. This principle can be carried straight forward to memory cells with more than two logical states (being able to store q-ary digits where q>2). Accordingly, average levels of analog signals representing any logical state or groups of states can be selected in order to initiate a refresh operation.

According to a second aspect which constitutes a further development of the first aspect of the invention said monitoring circuit is further arranged to receive a predetermined threshold value, to compare said average level with said threshold value, and to output said refresh command depending on the result of the comparison.

Hence, one way of monitoring said average level is to compare it with the predetermined threshold value. The threshold value, for example, can be a digital value for further processing obtained from a look-up table or it can be directly supplied as an analog signal. Instead of one there can also be provided several threshold values allowing for a differentiated monitoring of said average value and/or for monitoring average values assigned to different logical states, or the like. Also, a single threshold value may be input and multiple thresholds may be deduced according to a predetermined relation.

Comparison can be accomplished in different ways (depending on the signals selected for averaging). For example, the refresh command can be output so that a range of said memory array will be reprogrammed when the average level falls below the threshold value. In another embodiment the refresh command can be output when a first average level assigned to a first logical state falls below a first threshold value and a second average level assigned to a second logical state exceeds a second threshold value.

According to a third aspect which constitutes a further development of the first or second aspect of the invention said non-volatile memory device further comprises selection means coupled to said plurality of bit line conductors, said selection means being arranged to select from respective analog signal levels on said plurality of bit line conductors those being assigned to a data signal of at least one predetermined logical state, whereby said averaging circuit is coupled to said selection means, said averaging circuit being arranged to determine a selected average level on respective analog signal levels selected by said selection means.

In this embodiment the averaging circuit is indirectly coupled to the plurality of bit line conductors via the selection means. This allows for selectively averaging analog signals representing one or several selected logical states for further monitoring/comparison.

According to a fourth aspect which constitutes a further development of the third aspect of the invention said monitoring circuit is arranged to compare said selected average level with an over-all average level determined on respective analog signal levels on all of said plurality of bit line conductors, and to output said refresh command depending on the result of the comparison.

Herein a relative behaviour between the over-all average level and one selected average level is monitored. In order to determine the over-all average level respective analog signal levels on all of said plurality of bit line conductors may either be by-passed the selection means or passed through the selection means depending on the layout of the averaging circuit, the selection circuit and the connectivity.

In case of a binary memory according to fifth and sixth aspects which constitute further developments of the fourth aspect of the invention the selecting means could either select those bit line conductors carrying signals being assigned to "high" data signals (representing logical "1" states) or those bit line conductors carrying signals being assigned to "low" data signals (representing logical "0" states). The averaging circuit, consequently, is arranged to determine an average "high" level or an average "low" level and an "over-all" average level, respectively. The monitoring circuit compares said average "high"/"low" level with said over-all average level. I.e. the monitoring circuit may be further arranged to receive a predetermined threshold value and the refresh command then may be output, for example, when the difference between the average "high" level and the over-all average level, and between the over-all average level and the average "low" level, respectively, falls below said predetermined threshold value.

According to a seventh aspect which constitutes a further development of the third aspect of the invention said monitoring circuit is arranged to compare said selected average level with another selected average level, and to output said refresh command depending on the result of the comparison.

Herein a relative behaviour between the selected average levels assigned to two different logical states, for example, are monitored. The analog signals can be selected successively or in parallel depending on the layout of the selection circuit.

In case of a non-volatile binary memory device, such as flash memory, according to an eighth aspect which constitutes a further development of the seventh aspect of the invention said selection means are arranged to select from respective analog signal levels on said plurality of bit line conductors those being assigned to "low" data signals (representing logical "0" states) and those being assigned to "high" data signals (representing logical "1" states). The averaging circuit is arranged to determine an average "low" level and an average "high" level on respective analog signal levels selected by said selection means.

The monitoring circuit is further arranged to receive a predetermined threshold value and to output said refresh command when the difference between said average "high" level and said average "low" level falls below said threshold value.

According to a ninth aspect which constitutes a further Development of any one of the first to eights aspects of the invention the non-volatile memory device further comprises sensing means coupled to said bit line conductors, said sensing means being arranged to form respective data signals, each by comparing a respective analog signal from a plurality of the bit line conductors with said average level output by said averaging means.

This leads to a bit detector mechanism for solid-state memories as proposed in earlier applications EP04103588.2 filed at Jul. 27, 2004 and EP 04101675.9 filed at Apr. 22, 2004 of the same proprietor. This mechanism uses an essentially DC-free coding scheme transforming user digits (typically bits) in channel digits (typically bits) provided that only words from a selected subset of all possible words are used. These words are selected so that the net difference between numbers of digits (typically bits) at respective logic levels are within a predetermined sub-range of the range from zero to the number of bit-lines in the word. In case of a binary system, preferably, they are selected so that half the channel bits are of logical state "1" and the other half of the channel bits are of logical state "0". The averaging means consequently outputs an "over-all" average level signal arranged about the middle between ideal analog signal levels being assigned to "low" and "high" data signals.

The over-all average level according to this embodiment at the same can be employed to trigger the refresh operation and as reference level (hereinafter also referred to as optimal detection threshold ) for the sensing circuit to assign the analog electrical signals on the bitlines either to one logical value or the other (bit detection). The other way around, when the optimal detection threshold is determined any way for bit detection there are almost no additional hardware costs to apply the memory refresh mechanism according to the invention.

The above object according to a tenth aspect of the present invention is further achieved by a method of refreshing a non-volatile memory device comprising: receiving analog output signals from a plurality of memory cells, determine an average level on respective analog output signal levels from said memory cells, monitoring said average level, outputting a refresh command when said average level shows a predetermined behaviour, and refreshing at least a selection of said plurality of memory cells in response to said refresh command.

The above and other objects, features and advantages of the present invention will become apparent from the following description of preferred embodiments thereof taken in conjunction with the accompanying drawings in which.

Figure 1:
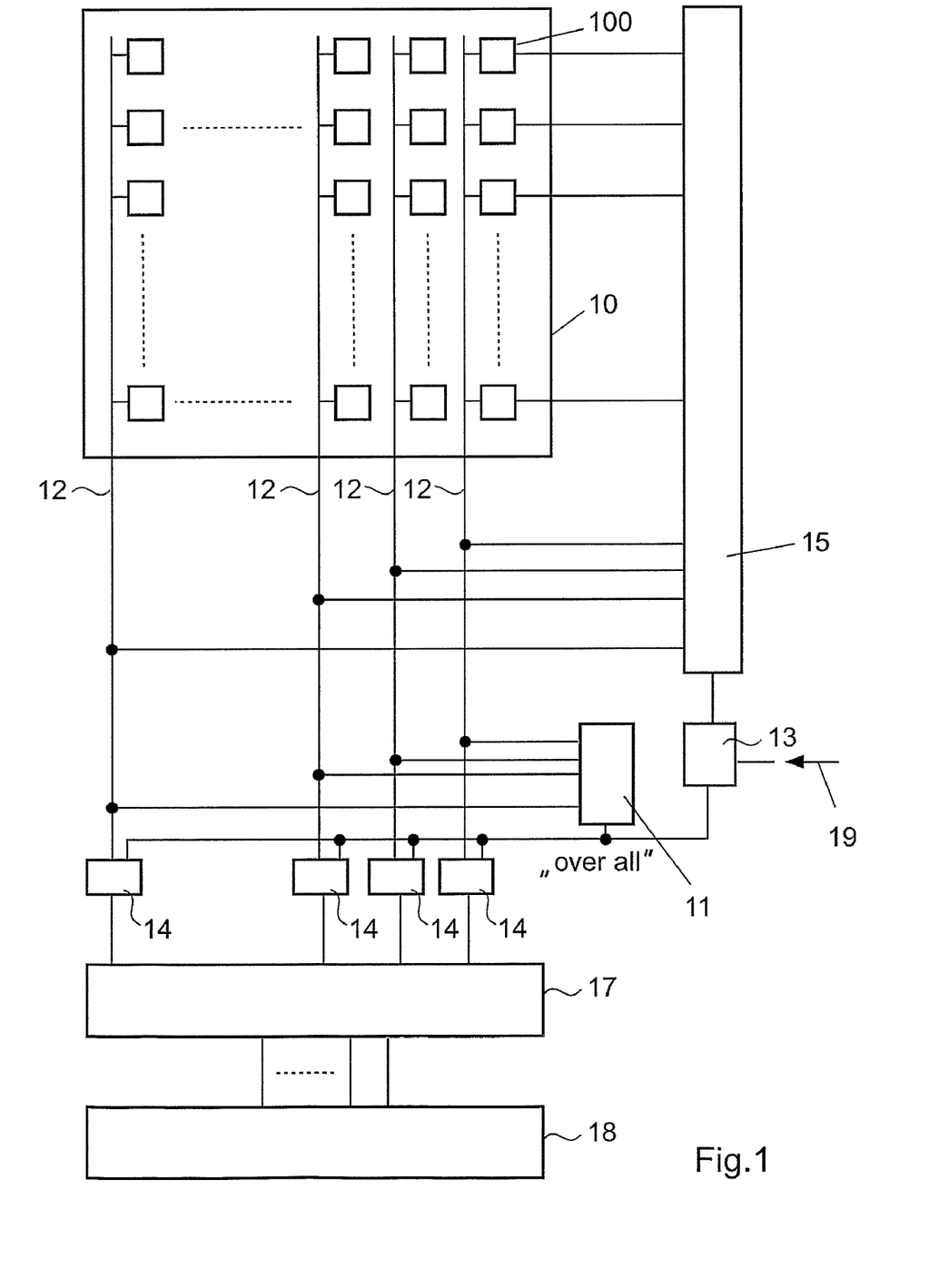
FIG. 1 shows a block diagram with a memory device according to a first embodiment of the invention.

FIG. 1 shows an electronic circuit with a memory array 10 comprising a matrix of rows and columns of memory cells 100 (only one provided with a reference numeral). Each column of cells 100 is coupled to a respective bit line conductor 12. The bit line conductors 12 are coupled to first inputs of respective sensing means (sense amplifiers) 14 and to inputs of an averaging circuit 1. The averaging circuit has an output coupled in common to second inputs of the sense amplifiers 14 and to a first input of a monitoring circuit 13. A second input of the monitoring circuit 13 is shown for input of a reference value indicated by arrow 19. The monitoring circuit is coupled with its output to a refresh circuit 15. The refresh circuit is coupled to said memory array 10 in order to execute a refresh operation in known manner. The sense amplifiers 14 have outputs coupled to processing circuits 18, via word conversion circuits 17. Typically, the entire circuit of FIG. 1 is integrated in a single semi-conductor integrated circuit.

In operation, each memory cell 100 stores information about a respective binary value in the form of a value of an analog physical property. For example in the form of an amount of charge present on an electrically isolated electrode, or in the form of a magnetization of a piece of magnetic material, etc. When the information has to be read a plurality of cells 100, for example from a row of cells or a part of a row, is selected by an addressing circuit (not shown). In response, the selected cells apply information dependent electrical signals, for example in the form of voltages on bit-line conductors 12. When the electrical signals from the cells are currents on bit line conductors 12 also current copying circuits may be provided between bit line conductors 12 and the averaging circuit 11 and the first inputs of the sense amplifiers 14. Averaging circuit 11 then supplies respective, mutually equal reference currents to the second inputs of sense amplifiers 14. Current copying circuits [Are the current copying circuits shown somewhere? Why do they have a number? This number intervenes with the numbering in FIG. 2.] may be implemented for example as two-output current mirror circuits.

Averaging circuit 11 receives the electrical signals (currents and/or voltages) and according to this embodiment outputs an electrical signal corresponding to an average value of electrical signals on all bit-line conductors 12 connected to the averaging circuit. This average level on one hand is fed to the monitoring circuit 13 in order to monitor its behaviour by comparing it with the input threshold value 19. On the other hand, the averaging circuit 11 at same time acts as reference level selection circuit. The average level is fed to the sense amplifiers 14 as reference level for forming data signals by comparing it with the analog signal on the bit line conductors 12. For this purpose it is important to make sure that the (over-all) average level is not too much affected by the content stored in the memory. Therefore an essentially DC-free coding scheme transforming user bits in channel bits should be used. The averaging circuit 11 determines the average of the electrical signals on bit line conductors 12 based on the content of the bits in words that are stored in memory 10. A word is defined by the content of cells 100 that apply electrical signals in parallel to sense amplifiers 14 when a memory address is selected. All addressable words in memory 10 are preferably selected from a subset of possible words, so that each word contains substantially as many logical ones as zeros. For example, in case of nine bit words there are 420 words with between three and six logical ones. 256 of these words may be selected for use to represent 8-bit data words data in memory 10.

The averaging circuit 11 may comprise a multi-output current mirror with an input/output factor of 1/n, input currents from being fed to a common input transistor, which mirrors the sum of the input currents, divided by n, through output transistors to the second inputs of sense amplifiers 14. The input output factor is realized for example by making the input transistor n times as wide as the output transistor, or by using n input transistors of the same size as the output transistors in parallel. Of course, averaging can also be realized for voltage output signals, using for example a summing circuit with a plurality of resistors coupled between bit line conductors 12 and a summing node and a buffer amplifier coupled between the summing node and the second inputs of sense amplifiers 14.

The monitoring circuit 13 in this embodiment may be of any suitable type, including for example differential amplifier circuits, cross-coupled amplification circuits (as used for DRAMs), current mode sense amplifiers and the like. When the comparison result shows that the average level exceeds or falls below the predetermined threshold 19, e.g. when the difference between the average level signal provided by the averaging circuit 11 and the threshold value changes sign, the monitoring circuit 13 outputs the refresh command to the refreshing circuit 15.

The refreshing circuit 15 may be arranged to erase the memory array 10 or at to least a selection or block(s) of the memory cells 100 and afterwards to reprogram it again.

More precisely, the memory (blocks) that has to be refreshed may be read first and the currently read data may be temporarily stored, e.g. in the sense amplifiers, for re-writing it into the same memory (blocks) after erasing. For example, a source erase method, a channel erase method or page erase method may be applied.

Sense amplifiers 14 compare the electrical signals on respective bit line conductors 12 with the average or reference level and output logic one or zero signals, dependent on whether the electrical signals on bit line conductors 12 are above or below the reference level respectively. Sense amplifiers 14 may be of any suitable type for this purpose, also including for example differential amplifier circuits, cross-coupled amplification circuits, current mode sense amplifiers etc.

Conversion circuit 17 translates the combination of logic ones and zeros from sense amplifiers 14 into a translated data word and, in particular into said DC-free channel code described above. Processing circuits 18 use the translated data word for a data processing function that is particular to the circuit.

Figure 2:
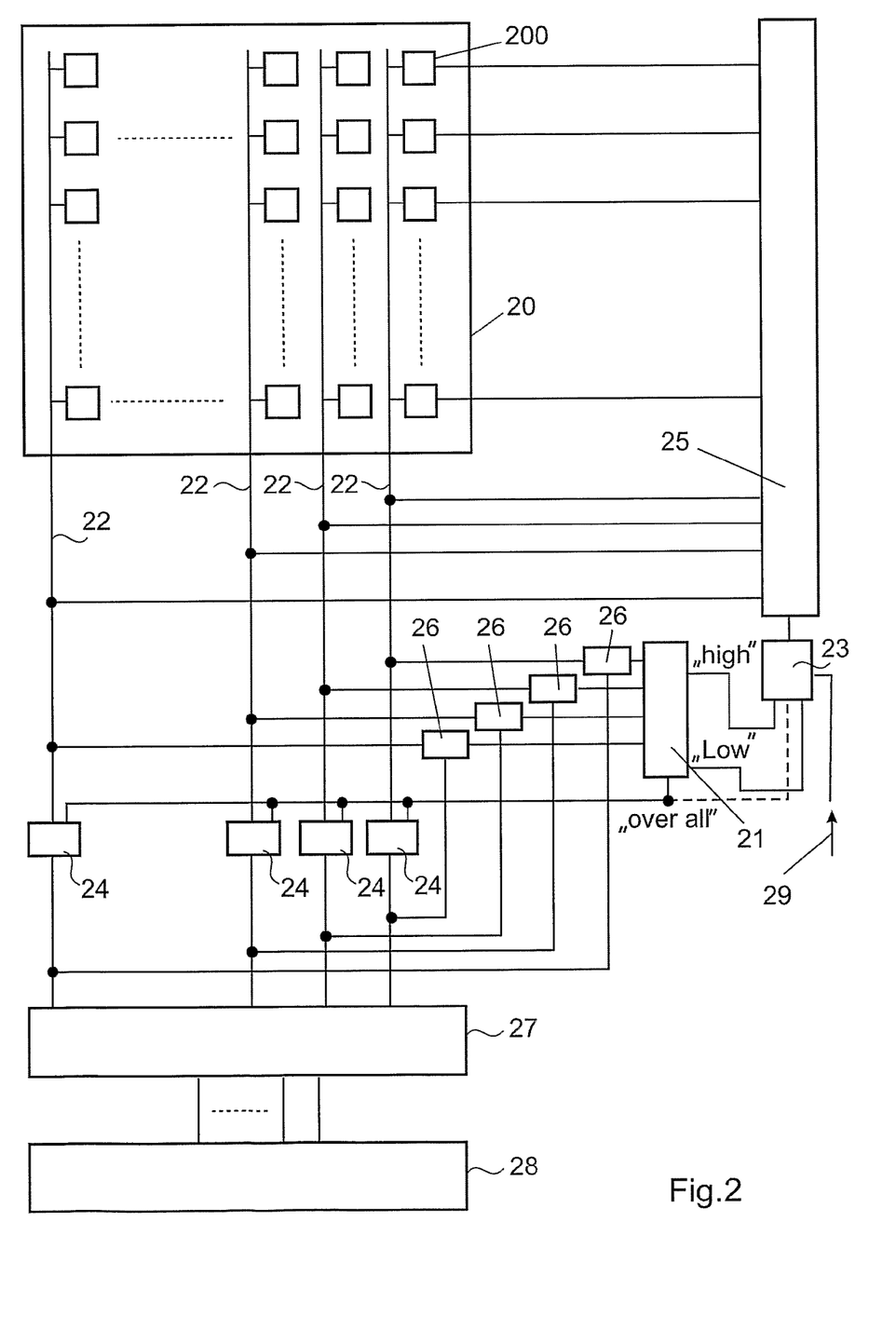
FIG. 2 shows a block diagram with a memory device according to a second embodiment of the invention.

FIG. 2 shows an alternative embodiment of the memory device further comprising selection means 26 with a first input coupled to the bit lines 22. A second input is coupled to the output of the sensing means 24. The logic one or zero signals gathered from the sensing means output, are utilized either to put through the analog electrical signals on respective bit line conductors 22 to the averaging means 21 or to block respective analog signals. By this means the average level is formed by analog signals representing one (or several) selected logical states, only. The so formed average "high" or average "low" levels are output to the monitoring means for further monitoring. Further, an "over-all" average level can be formed by putting through all analog signals without bit selection (actually by selecting all logical states). Comparison can be made in the monitoring circuit 23 between each pair of input of average levels. Furthermore, a threshold value can be input and utilized for this purpose.

Figure 3:
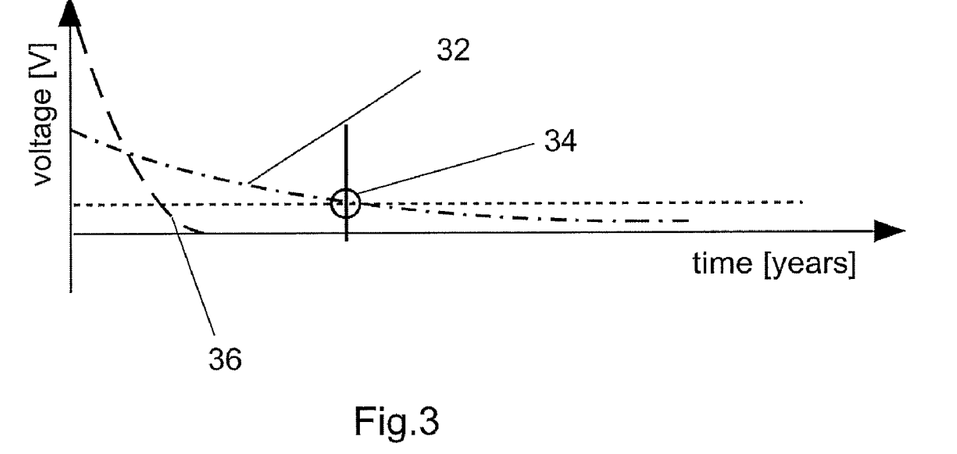
FIG. 3 is a diagram showing an "over-all" average level behaviour and a predetermined threshold level triggering the refresh operation.

Diagram of FIG. 3 shows the behaviour of the "over-all" average voltage level 32 and the threshold value (dotted line) input into a monitoring circuit 13 according to FIG. 1. At the intersection 34, i.e. when the average level 32 reaches the threshold, the refresh command is delivered to the refreshing circuit 15. In the simplest instance this task can be fulfilled by a differential amplifier. Line 36 denotes the behaviour of a mal-functioning memory cell that loses its charge abnormally quickly. Such a cell according to the invent will have a reduced influence on the average voltage level 36 and so does not invoke a refresh on its own.

Figure 4:
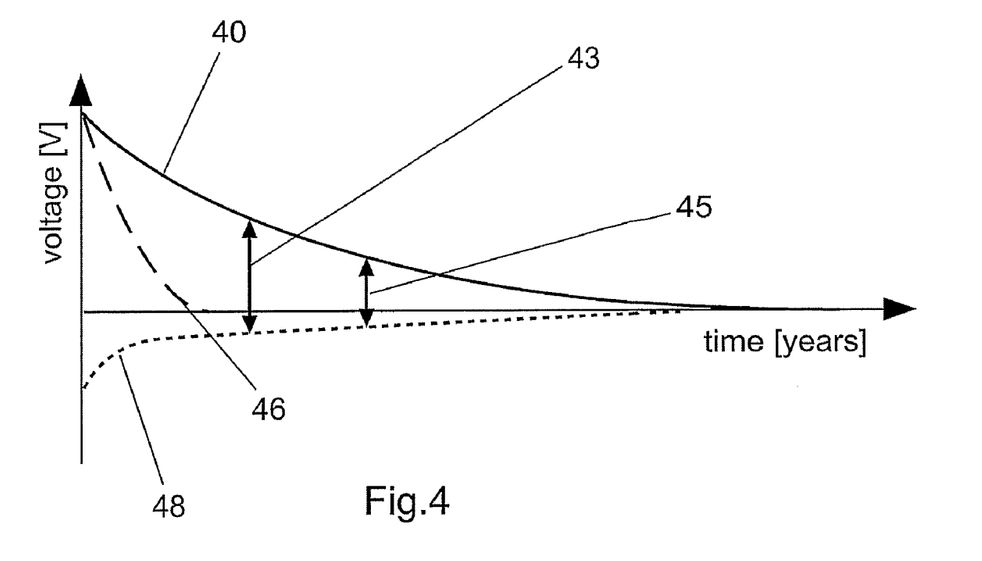
FIG. 4 is a diagram showing an average "high" level and average "low" level behaviour.

In an alternative solution according to FIG. 4 it is proposed to reprogram the range of memory when a distance 43 between the average 'high' level 40 and the average 'low' level 48 falls below a certain value 45. According to FIG. 2, this certain value is supplied to averaging circuit 23 in form of threshold value 29 via respective input. The refresh command in this case can be obtained by subtracting the average "low" level 48 and the threshold value 45 from the average "high" level 40. In contrast, line 46 again denotes the behaviour of a malfunctioning memory cell.

Figure 5:
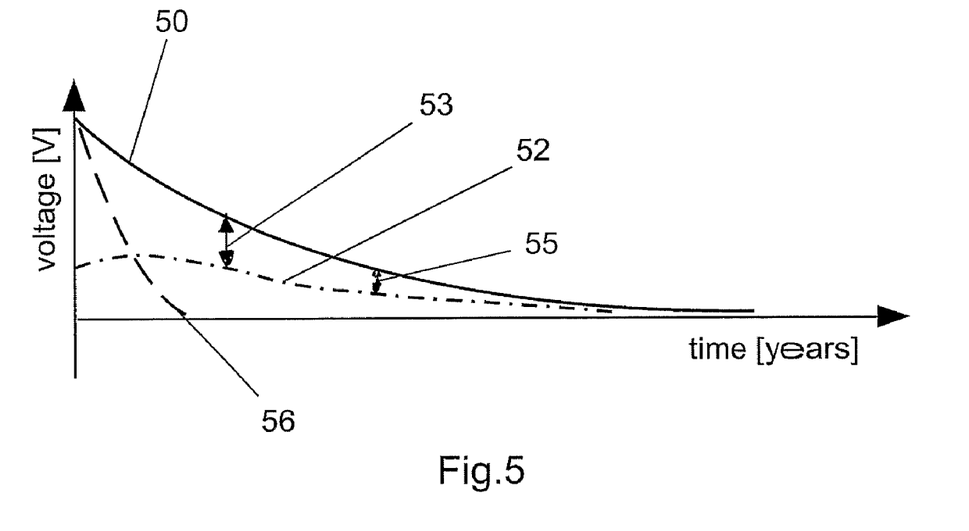
FIG. 5 is a diagram showing an average "high" level and an "over-all" average level behaviour.

In another alternative solution according to FIG. 5 it is proposed to) reprogram the range of memory when the distance 53 between the average 'high' level 50 and the over-all average level 52 falls below a predetermined threshold value 55. This requires that a DC-free channel code as described above is applied to the user data by said conversion circuit 27. The refresh command in this case will be obtained by subtracting the over-all average level 52 and the threshold value 55 from the average "high" level 50. In contrast, line 56 again denotes the behaviour of a mal-functioning memory cell.

Figure 6:
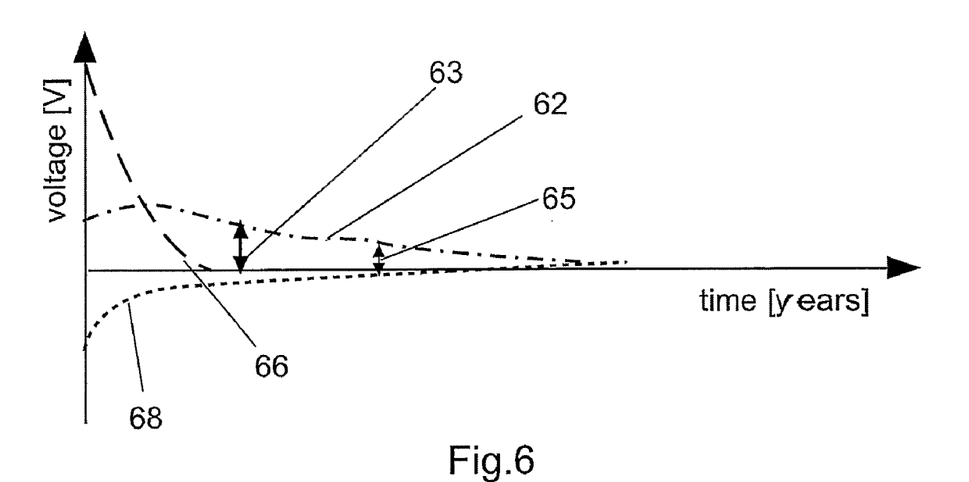
FIG. 6 is a diagram showing an "over-all" average level and an average "low" level behaviour.

According to yet another embodiment as depicted in FIG. 6 it is proposed to reprogram the range of memory when the distance 63 between the average 'low' level 68 and the overall average level 62 falls below a certain value 65. This again requires that a DC-free channel code is applied to the user data by said conversion circuit 27. The refresh command in this case will be obtained by subtracting the over average "low" level 68 and the threshold value 65 from the over-all average level 62. In contrast, line 66 again denotes the behaviour of a mal-functioning memory cell.

The averaging circuit 11, 21 determines the average of the electrical signals on bit line conductors 12, 22 based on the content of the bits in words that are stored in memory 10, 20. A word is defined by the content of cells 100, 200 that apply electrical signals in parallel to sense amplifiers 14, 24 when a memory address is selected. All addressable words in memory 10, 20 are preferably selected from a subset of possible words, so that each word contains substantially as many logical ones as zeros.

When each bit for such a word is programmed the physical property (charge, magnetization etc.) is nominally set to respective different values in the case of a logical one or zero respectively. If these nominal values result in a bit line signal value of A1 or A0 (A1>A0) during reading respectively, then, the average of the bit lines lies between $$(min*A1+(n-min)*A0)/n \leq \text{Average} \leq (max*A1+(n-max)*A0)/n$$

(herein "n" is the number of bits in the word, "min" is the minimum number of bits in any of the words with the value of logic one and "max" is the maximum number of bits in any of the words with the value of logic one). The particular average depends on the specific word that has been programmed into the memory. Any value in this range may be used as average level. During sensing this ensures a margin of at least min*(A1−A0)/n for logic zeros and a margin of (1−max/n)*(A1−A0) for logic ones. That is, in the example of n=9, with min=3 and max=6, there is a margin of (A1−A0)/3 between the selected average reference level and both logic zeros and ones. As the word size n becomes larger, a larger margin can be realized. In another example, when n=33 and min=15 and max=18 one can store 32 user bits and there is a margin of (A1−A0)*15/33 on both sides which is already almost equal to the full margin (A1−A0)/2.

Due to errors or physical effects the analog signal on a bit line conductor 12, 22 may shift from the nominal values A1, A0. Common shifts of signals on all bit line conductors 12, 22 that carry a logic one, or another common shift on all bit line conductors 12, 22 that carry a logic zero, or both, do not affect the sensing result, as long as the signal levels for logic ones and zeros remain distinguishably apart.

Errors may arise only if there are mutually different shifts in the signals on bit line conductors 12, 22 that represent the same logic signal. The error margins for a shift of this type in a single signal are more than (1−max/n)*(A1−A0) and min*(A1−A0)/n. These margins can be adapted by using a set of storage words with adapted values of max and min. Selecting max and min further from n and 0 respectively increases the margins, but reduces the number of available words. The margins are preferably set to the minimum level that is needed to prevent errors due to specified allowable shifts in the logic one and zero levels.

In an embodiment, the encoded words for use as storage words are formed algorithmically, by inverting a subset S of the bits from the data word, but not the other bits of the data word, to form an encoded word. The subset is selected so that a net difference M(S) of numbers of logical zero and logical one bits in the subset is within a predetermined range relative to the total net difference M of numbers of logical zero and logical one bits in the data word as a whole. The subset is for example a subset of bits with successive bit sequence numbers up to a selected sequence number in the word. In an embodiment the range is a range of a predetermined distance above and below half the total net difference. It may be noted that an embodiment of a similar technique for generating data words wherein the net difference M=0 is known per se from U.S. Pat. No. 4,309,694. In this document this technique is not disclosed for the selection of a average level nor for selecting a larger set of data words where M is near zero, but not necessarily zero.

In a further embodiment the signals from bit line conductors 12, 22 may be clipped before taking the average, so that bit lines conductors that carry excessively large signals do not contribute more than a maximum and/or no less than a minimum to the average. More generally, saturation may be used, taking an average of the results of applying an S-shaped saturating function to the signals from the bit line conductors (Saturating, as used herein, includes clipping. By definition the slope of a saturating function decreases as a function of the distance of the signals to the most sensitive (normal) range), so that the ratio between the contribution to the sum and the signal is less as the signal is deviation from the normal range decreases, even if the contribution itself still increases.). For this purpose clipping or saturating circuits (not shown) may be inserted between bit line conductors 12, 22 and the inputs of averaging circuit 11, 21.

In a further embodiment memory array 10, 20 may contain cells 100, 200 that can be programmed to more than two levels, e.g. to four levels. Thus, more information can be stored per cell in memory array 10, 20. In this embodiment, comparison with a plurality of average or reference levels is used to digitize the output signals from bit line conductors 12, 22. In accordance with the invention, at least one of these average levels and preferably all average levels are selected dependent on the signal level of a plurality of bit line conductors 12, 22 that also carry data information. Accordingly, a plurality of analog signals assigned to respective logical states can be selected by selecting means 26 and respective intermediate average levels can be obtained and monitored.

Any scheme may be used to assign storage words to data words from processing circuits 18 and vice versa. In one embodiment lookup table memories are used for translation. A first lookup table memory in write translation circuit is addressed by data words from processing circuits 18 and the addressed locations in the lookup table memory contain the associated storage words. Similarly, a second look up table memory in read translation circuit is addressed by storage words and the addressed locations in the lookup table memory contain the associated data words for use by processing circuits 18 In this embodiment the storage words and the relation between storage words and data words may be hand picked from storage words that meet whatever condition is necessary for selection of the average level (or levels). The function of the lookup memory may also be realized by means of logic circuits that implement the input/output relation defined by the table in the look-up memory.

However, the translation by means of circuits with a lookup memory function has the disadvantage that additional memory circuits are needed. Also, the lookup memory may cause disadvantageous reading and/or writing delays.

In another embodiment the storage words are selected algorithmically. Several schemes may be used. In one scheme the storage word is formed from the data word by copying a selected first part of the bits of a data word and copying the logical inverse of the remaining bits into the storage word. The parts are selected so that the resulting storage word meets the conditions on the storage word. Additional information is added to indicate which part of the bits has been inverted and the additional bits are added to the storage word.

Although the invention has been described with the aid of specific embodiments, it should be appreciated that the invention can be implemented in other ways. For example it should be clear that the role of logic ones and zeros may be exchanged. Similarly, it should be appreciated that the plurality of bits that is used to select the average level can contain any number of bits, provided that storage only words are used that contain the required net number of bits

The invention claimed is:

1. Non-volatile memory device, comprising
a memory array with a plurality of memory cells being arranged in rows and columns,
bit line conductors being coupled to said rows of memory cells,
an averaging circuit with inputs coupled to a plurality of said bit line conductors, said averaging circuit being arranged to determine an average level on respective analog signal levels on said plurality of bit line conductors,
a monitoring circuit coupled to said averaging circuit, said monitoring circuit being arranged to monitor said average level and to output a refresh command when said average level shows a predetermined behaviour, and
a refresh circuit being coupled to said monitoring circuit and being arranged to refresh at least a selection of said plurality of memory cells in response to said refresh command.

2. Non-volatile memory device according to claim 1, wherein said monitoring circuit is further arranged to receive a predetermined threshold value to compare said average level with said threshold value, and to output said refresh command depending on the result of the comparison.

3. Non-volatile memory device according to claim 1, further comprising
selection means coupled to said plurality of bit line conductors, said selection means being arranged to select from respective analog signal levels on said plurality of bit line conductors those being assigned to a data signal of at least one predetermined logical state,
whereby said averaging circuit is coupled to said selection means, said averaging circuit being arranged to determine a selected average level on respective analog signal levels selected by said selection means.

4. Non-volatile memory device according to claim 3, wherein said monitoring circuit is arranged to compare said selected average level with an over-all average level determined on respective analog signal levels on all of said plurality of bit line conductors, and to output said refresh command depending on the result of the comparison.

5. Non-volatile binary memory device according to claim 4,
wherein said selection means are arranged to select from respective analog signal levels on said plurality of bit line conductors those being assigned to "high" data signals,
wherein said averaging circuit is arranged to determine an average "high" level on respective analog signal levels selected by said selection means, and
wherein said monitoring circuit is further arranged to receive a predetermined threshold value and to output said refresh command when a difference between said average "high" level and said over-all average level falls below said threshold value.

6. Non-volatile binary memory device according to claim 4,
wherein said selection means are arranged to select from respective analog signal levels on said plurality of bit line conductors those being assigned to "low" data signals,
wherein said averaging circuit is arranged to determine an average "low" level on respective analog signal levels selected by said selection means, and
wherein said monitoring circuit is further arranged to receive a predetermined threshold value and to output said refresh command when a difference between said over-all average level and said average "low" level falls below said threshold value.

7. Non-volatile memory device according to claim 3, wherein said monitoring circuit is arranged to compare said selected average level with another selected average level, and to output said refresh command depending on the result of the comparison.

8. Non-volatile binary memory device according to claim 7,
wherein said selection means are arranged to select from respective analog signal levels on said plurality of bit line conductors those being assigned to "low" data signals and those being assigned to "high" data signals,
wherein said averaging circuit is arranged to determine an average "low" level and an average "high" level on respective analog signal levels selected by said selection means, and
wherein said monitoring circuit is further arranged to receive a predetermined threshold value and to output said refresh command when the difference between said average "high" level and said average "low" level falls below said threshold value.

9. Non-volatile memory device according to any one of the preceding claims, further comprising
sensing means coupled to said bit line conductors, said sensing means being arranged to form respective data signals, each by comparing a respective analog signal from a plurality of the bit line conductors with said average level output by said averaging means.

10. Method for refreshing a non-volatile memory device comprising
receiving analog output signals from a plurality of memory cells
determine an average level on respective analog output signal levels from said memory cells,
monitoring said average level,
outputting a refresh command when said average level shows a predetermined behaviour,
refreshing at least a selection of said plurality of memory cells in response to said refresh command.

11. Method according to claim 10 further comprising,
receiving a predetermined threshold value,
wherein said monitoring includes comparing said average level with said threshold value, and said refresh command is output depending on the result of the comparison.

12. Method according to claim 10 further comprising,
selecting from said analog output signals received from said plurality of memory cells those being assigned to a data signal of at least one predetermined logical state,
whereby said average level is determined on said selected analog output signals.

13. Method according to claim 12,
wherein said monitoring includes comparing said selected average level with an over-all average level determined on respective analog output signal levels from all of said plurality of memory cells, and wherein said refresh command is output depending on the result of the comparison.

14. Method for refreshing a binary non-volatile memory device according to claim 13 further comprising,
receiving a predetermined threshold value,
wherein those analog output signals are selected which are assigned to "high" data signals, an average "high" level is determined on said selected analog output signals, said monitoring includes determining the difference between said average "high" level and said over-all average level, and said refresh command is output when with said difference falls below said threshold value.

15. Method for refreshing a binary non-volatile memory device according to claim 13 further comprising,
receiving a predetermined threshold value,
wherein those analog output signals are selected which are assigned to "low" data signals, an average "low" level is determined on said selected analog output signals, said monitoring includes determining the difference between said over-all average level and said average "low" level, and said refresh command is output when with said difference falls below said threshold value.

16. Method according to claim 12,
wherein said monitoring includes comparing said selected average level with another selected average level, and wherein said refresh command is output depending on the result of the comparison.

17. Method for refreshing a binary non-volatile memory device according to claim 16 further comprising,
receiving a predetermined threshold value,
wherein those analog output signals are selected which are assigned to "low" data signals and those which are assigned to "high" data, an average "low" level and an average "high" level are determined on said selected analog output signals, respectively, said monitoring includes determining the difference between said average "high" level and said average "low" level, and said refresh command is output when with said difference falls below said threshold value.

18. Method for refreshing a binary non-volatile memory device according to claim 17, further comprising,
forming respective data signals, each by comparing a respective analog output signal levels from said memory cells, with said average level.

* * * * *